(12) United States Patent
Ward

(10) Patent No.: US 7,414,243 B2
(45) Date of Patent: Aug. 19, 2008

(54) TRANSMISSION ION MICROSCOPE

(75) Inventor: Billy W. Ward, Merrimac, MA (US)

(73) Assignee: ALIS Corporation, Peabody, MA (US)

( * ) Notice: Subject to any disclaimer, the term of this patent is extended or adjusted under 35 U.S.C. 154(b) by 0 days.

(21) Appl. No.: 11/146,741

(22) Filed: Jun. 7, 2005

(65) Prior Publication Data

US 2006/0284091 A1    Dec. 21, 2006

(51) Int. Cl.
    *G01N 23/00* (2006.01)
(52) U.S. Cl. ...................... 250/309; 250/306
(58) Field of Classification Search .............. 250/309, 250/311
    See application file for complete search history.

(56) References Cited

U.S. PATENT DOCUMENTS

| | | | |
|---|---|---|---|
| 3,602,710 A | | 8/1971 | Mueller |
| 3,868,507 A | | 2/1975 | Panitz |
| 4,044,255 A | * | 8/1977 | Krisch et al. ................ 250/311 |
| 4,139,773 A | | 2/1979 | Swanson |
| 4,236,073 A | * | 11/1980 | Martin ........................ 250/306 |
| 4,352,985 A | * | 10/1982 | Martin ........................ 250/306 |
| 4,451,737 A | * | 5/1984 | Isakozawa ................... 250/311 |
| 4,467,240 A | * | 8/1984 | Futamoto et al. ............ 313/336 |
| 4,639,301 A | | 1/1987 | Doherty et al. |
| 4,721,878 A | | 1/1988 | Hagiwara et al. |
| 4,874,947 A | | 10/1989 | Ward et al. |
| 4,954,711 A | | 9/1990 | Fink et al. |
| 5,034,612 A | * | 7/1991 | Ward et al. .................. 250/423 |
| 5,188,705 A | | 2/1993 | Swanson et al. |
| 5,393,977 A | * | 2/1995 | Okura et al. ................. 250/306 |
| 5,414,261 A | * | 5/1995 | Ellisman et al. ............. 250/311 |
| 5,750,990 A | | 5/1998 | Mizuno et al. |
| 5,783,830 A | * | 7/1998 | Hirose et al. ........... 250/192.21 |
| 5,976,390 A | | 11/1999 | Muramatsu |
| 6,042,738 A | | 3/2000 | Casey et al. |
| 6,211,527 B1 | | 4/2001 | Chandler |
| 6,268,608 B1 | | 7/2001 | Chandler |
| 6,354,438 B1 | | 3/2002 | Lee et al. |
| 6,395,347 B1 | | 5/2002 | Adachi et al. |
| 6,414,307 B1 | | 7/2002 | Gerlach et al. |
| 6,504,151 B1 | | 1/2003 | Mitchell et al. |

(Continued)

FOREIGN PATENT DOCUMENTS

EP    0 477 992 A2    4/1992

(Continued)

OTHER PUBLICATIONS

Escovitz, W. H. et al., "Scanning Transmission Ion Microscope with a Field Ion Source", Feb. 24, 1975, Proceedings of the National Academy of the Sciences, vol. 72, No. 5, Published May 1975, pp. 1826-1828.*

(Continued)

*Primary Examiner*—David A. Vanore
(74) *Attorney, Agent, or Firm*—Fish & Richardson P.C.

(57) ABSTRACT

Transmission ion microscope. A bright light ion source generates an ion beam that is focused on a sample by an electrostatic condenser lens means. An objective lens focuses the ion beam transmitted through the sample to form an image. A projector lens enlarges the image and a phosphor screen receives the enlarged image to generate light allowing visualization of the image.

21 Claims, 1 Drawing Sheet

U.S. PATENT DOCUMENTS

| | | | |
|---|---|---|---|
| 6,538,254 B1 | 3/2003 | Tomimatsu et al. | |
| 6,579,665 B2 | 6/2003 | Lee et al. | |
| 6,700,122 B2 | 3/2004 | Matsui et al. | |
| 6,750,451 B2* | 6/2004 | Koguchi et al. | 250/311 |
| 6,753,535 B2 | 6/2004 | Rose | |
| 6,791,084 B2 | 9/2004 | Shimoma et al. | |
| 6,822,245 B2 | 11/2004 | Muto et al. | |
| 6,875,981 B2 | 4/2005 | Nishikawa | |
| 7,067,867 B2* | 6/2006 | Duan et al. | 257/296 |
| 7,084,399 B2 | 8/2006 | Muto et al. | |
| 2002/0134949 A1 | 9/2002 | Gerlach et al. | |
| 2002/0144892 A1 | 10/2002 | Lee et al. | |
| 2003/0062487 A1 | 4/2003 | Hiroi et al. | |
| 2004/0031936 A1 | 2/2004 | Oi et al. | |
| 2004/0121069 A1 | 6/2004 | Ferranti et al. | |
| 2006/0060777 A1 | 3/2006 | Motoi et al. | |
| 2006/0097166 A1* | 5/2006 | Ishitani et al. | 250/310 |
| 2006/0151697 A1* | 7/2006 | Inada et al. | 250/310 |
| 2006/0197017 A1 | 9/2006 | Motoi et al. | |
| 2007/0025907 A1 | 2/2007 | Rezeq et al. | |

FOREIGN PATENT DOCUMENTS

| | | | |
|---|---|---|---|
| GB | 1 604 898 | | 12/1981 |
| JP | 5209844 | | 12/1983 |
| JP | 1-130450 | | 5/1989 |
| JP | 07045230 A | * | 2/1995 |
| JP | 2001/176440 | | 6/2001 |

OTHER PUBLICATIONS

Fink, H.-W., "Mono-atomic tips for scanning tunneling microscopy", IBM J. Res. Develop. 30: 460-465 (1986).
Fink, H.-W., "Point Source for Ions and Electrons", Physica Scripta 38: 260-263 (1988).
Binh, V.T., "In situ fabrication and regeneration of microtips for scanning tunneling microscopy", J. Microscopy 152(2): 355-361 (1988).
Stocker, W. et al., "Low-energy electron and ion projection microscopy", Ultramicroscopy 31: 379-384 (1989).
Bell, A.E. et al., "High-field ion sources", Rev. Sci. Instrum. 61(1): 363-365 (1990).
Schmid, H. et al., "Combined electron and ion projection microscopy", Appl. Surf. Sci. 67: 436-443 (1993).
Muller, H.U. et al., "Emission properties of electron point sources", Ultramicroscopy 50: 57-64 (1993).
Horch, S. et al., "Field emission from atomic size sources", J. Appl. Phys. 74(6): 3652-3657 (1993).
Fink, H.-W. et al., "Electron and Ion Microscopy Without Lenses", *Nanostructures and Quantum Effects* (Springer-Verlag, 1994), pp. 17-27.
Edinger, K. et al., "Development of a high brightness gas field ion source", J. Vac. Sci. Technol. B 15(6): 2365-2368 (1997).
Horiuchi, K. et al., "Emission characteristics and stability of a helium field ion source", J. Vac. Sci. Technol. B 6(3): 937-940 (1988).
Melngailis, J., "Focused ion beam technology and applications", J. Vac. Sci. Technol. B 5(2): 469-495 (1987).
Fu, T.-Y. et al., "Method of creating a Pd-covered single-atom sharp W pyramidal tip: Mechanism and energetics of its formation", Phys. Rev. B 64: 113401-1-4 (2001).
Lucier, A.-S., "Preparation and Characterization of Tungsten Tips Suitable for Molecular Electronics Studies", excerpts from MSc Thesis, McGill University, 2004.
Fotino, M., "Tip sharpening by normal and reverse electrochemical etching", Rev. Sci. Instrum. 64(1): 159-167 (1993).
Wengelnik, H. et al., "Oxygen-induced sharpening process of W(111) tips for scanning tunneling microscope use," J. Vac. Sci. Technol. A 8(1): 438-440 (1990).
Rezeq, M. et al., "Sharpening of a Field of Ion Microscope (FIM) Tungsten Tip by the Controlled Interation of Nitrogen with the Tip Surface Atoms," Abastract from APS March Meeting (2004).

McGuinness, P.E., "Seeing at Atomic Resolution is Believing: Welcome the Helium Ion Microscope", Scanning 27(6): 323 (2005).
Notte, J. et al., "Sample Interaction and Contrast Mechanisms of the Helium Ion Microscope" (Scanning Conference, Apr. 2006).
Notte, J.A. et al., "An Introduction to Helium Ion Microscopy and its Nanotechnology Applications" (NanoScience and Technology Institute, May 2006).
Ward, B.W. et al., "The Helium Ion Microscope: A New Tool for Nanoscale Microscopy and Metrology" (Electron, Ion, and Photon Beam Nanotechnology Conference, May 2006).
Morgan, J. et al., "An Introduction to the Helium Ion Microscope" (Microscopy Today, Jul. 2006).
Hill, R. et al., "The ALIS He Ion Source and its Application to High Resolution Microscopy" (Seventh International Conference on Charged Particle Optics, Jul. 2006).
Notte, J. et al., "An Introduction to Helium Ion Microscopy" (Microscopy and Micro-Analysis, Jul. 2006).
John Notte et al., "An Introduction to the Helium Ion Microscope" (Presentation at the Materials Research Society Meeting, Symposium LL: Focused Ion Beams for Analysis and Processing, Nov. 2006).
J. Melngailis, "Ion Sources for Nanofabrication & High Resolution Lithography," IEEE Proceedings of the 2001 Particle Accelerator Conference, Chicago, Illinoise, (2002).
K. Jousten et al. "Growth & Current Charities of a Stable field Ion Emitter," Ultramicroscope 26, pp. 301-312 (1988).
Qing Ji, "Maskless, Resistless Ion Beam Lithography Process," Ph.D. Dissertation, Department of Electrical Engineering and Computer Sciences, UCAL Berkeley (2003).
Russell P.E. et al., "Chemically and geometrically ehanced focused ion beam micromachining," Journal of Vacuum Science and Technology B, vol. 16, No. 4, Jul./Aug. 1998, 2494-2498.
Schmid et al., "In-line holography using low-energy electrons and photons: Applications for manipulation on a nanometer scale," Journal of Vacuum Science & Technology B: Microelectronics and Nanometer Structures, Nov. 1995, vol. 13, Issue 6, pp. 2428-2431.
Fink et al., "Atomic Resolution in Lensless Low-energy Electron Holography," Phys. Rev. Lett. 67, Issue 12-16 Sep. 1991, pp. 1543-1546.
Brune et al., "Surface migration of "hot" adatoms in the course of dissociative chemisorption of oxygen on Al(111)," Phys. Rev. Lett. 68, Issue 5-Feb. 3, 1992, pp. 624-626.
Fink et al., "Lattice Steps and Adatom Binding on Tungsten (211)," Surf. Sci., vol. 143, No. 1, pp. 125-144, Jul. 1984.
Schmid et al., "Mechanical and electronic manipulation of nanometer-sized wires," Nanotechnology, vol. 5, pp. 26-32, 1994.
Fink et al., "Coherent point source electron beams," Journal of Vacuum Science & Technology B: Microelectronics and Nanometer Structures, Nov. 1990, vol. 8, Issue 6, pp. 1323-1324.
Purcell et al., "Characterization of atomic-size metal ion sources," Journal of Vacuum Science & Technology B: Microelectronics and Nanometer Structures, Jan. 2001, vol. 19, Issue 1, pp. 79-86.
Thompson et al., "Towards a commercial gas field ion source," Proceedings of SPIE, vol. 2437.
Wilbertz et al., "Recent Progress in gas field ion source technology," Proceeding of SPIE, vol. 2194.
Mutsaers, "Nuclear Microprobe Design," Nuclear Instruments & Methods in Physics Research, Section—B: Beam Interactions with Materials and Atoms, Elsevier, Amsterdam, NL, vol. 113, No. 1, Jun. 1996, pp. 323-329.
Jaksic et al., "New Developments in IBIC for the Study of Change Transport Properties of Radiation Detector Materials," Nuclear Instruments & Methods in Physics Research, Section—B: Beam Interactions with Materials and Atoms, Elsevier, Amsterdam, NL, vol. 158, No. 1-4, Sep. 2, 1999, pp. 458-463.
Butz et al., "From Micro- to Nanoprobes: Auspices and Horizons," Nuclear Instruments & Methods in Physics Research, Section—B: Beam Interactions with Materials and Atoms, Elsevier, Amsterdam, NL, vol. 113, No. 1, Jun. 1996, pp. 317-322.
Tondare V. N., "Quest for high brightness, monochromatic noble gas ion sources," J.Vac.Sci.Technol., A 23, 1498 (2005).
Grivet et al., "Ion Microscopy: History and Actual Trends," Ann NY Acad Sci, 1978 NY Acad of Sci, vol. 306, Feb. 23, 1977, pp. 158-182.

Magnan, "The Proton Microscope," Nucleonics, vol. 4, No. 4, Apr. 1949, pp. 52-66.

Breese et al., "Ion optical study of a transmission ion microscope," Muclear instruments & Methods in Physics Research, Section - B: Beam Interactions with Materials and Atoms, Elsevier, Amsterdam, NL, vol. 158, No. 1-4, Sep. 2, 1999, pp. 236-240.

Valdiviez et al., "The mechanical design of a proton microscope for radiography at 800 MeV,"Institute of Electrical and Electronics Engineers: Proceedings of the 2003 Particle Accelerator Conference. PAC 2003. Portland, OR, May 12-16, 2003, Particle Accelerator Conference, New York, NY: IEEE, US. vol. 1 of 5, May 12, 2003.

Levi-Setti, "Proton Scanning Microscopy: Feasibility and Promise," Scanning Electron Microscopy. Proceedings of The Annual Scanning Electron Microscope Symposium, Chicago, IL., pp. 125-134, Apr. 11, 1974.

Levi-Setti et al., High Resolution Scanning Ion Probes: Applications to Physics and Biology, Nuclear Instruments & Methods, vol. 168, pp. 139-149, 1980.

* cited by examiner

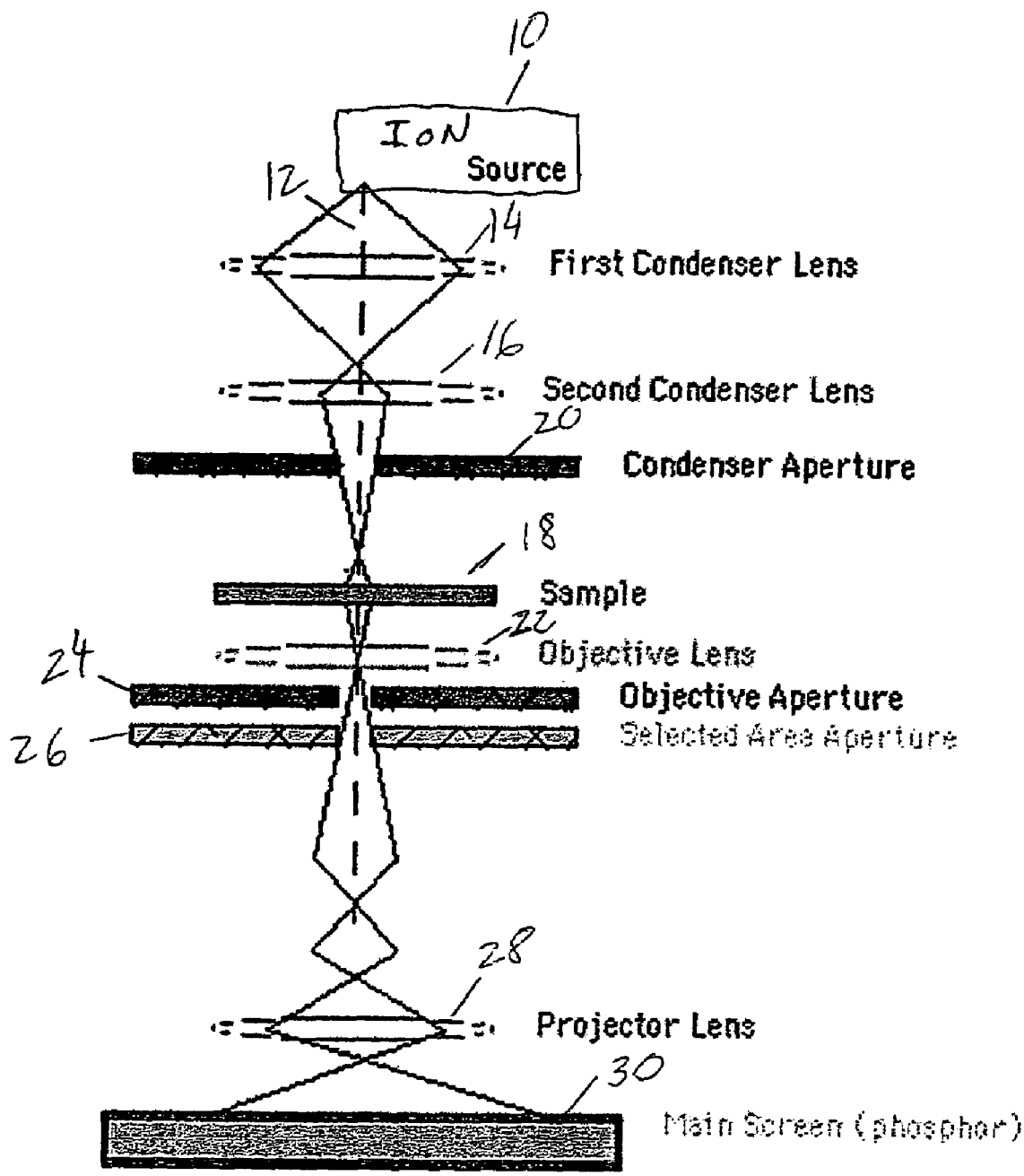
FIGURE

TRANSMISSION ION MICROSCOPE

BACKGROUND OF THE INVENTION

This invention relates to microscopy and more particularly to a transmission ion microscope using a bright light ion source.

The transmission electron microscope (TEM) has been in use for almost fifty years and has atomic or near atomic resolution. A transmission electron microscope sends a focused beam of electrons through a sample and an image is created on a phosphor screen by transmitted electrons so that atomic structure of the sample can be visualized. A TEM is a large, complex and expensive tool utilizing very high energy electrons. The use of very high energy electrons results in an operational burden.

Atomic level surface structure from thick samples can be obtained by scanning tunneling microscopy (STM) and, to a lesser extent, by atomic force microscopy (AFM). These are slow methods that require mechanically scanning a very fine needle-shaped tip over a sample. These methods cannot, however, provide information on what is below the top atomic layer of the sample.

A detailed understanding of the operation of the aforementioned, presently available TEM and STM microscopes is held by many persons skilled in the art of high resolution microscopes. There are myriad public domain publications, classroom text books, and microscope vendor publications that discuss such prior art microscopes. A commonly available publication provided by a microscope vendor is JEOL News, Vol. 37E, No. 1, 2002. Exemplary text books that teach the above mentioned microscopes include *Scanning Electron Microscopy and X-Ray Microanalysis* by Joseph Goldstein (Editor); *Scanning and Electron Microscopy: An Introduction* by Stanley L. Flagler, et al.; *High Resolution Focused Ion Beams: FIB and Its Applications* by John Orloff; *Materials Analysis Using A Nuclear Microprobe* by Mark B. H. Breese; and *Scanning Probe Microscopy and Spectroscopy: Theory, Techniques and Applications* by Dawn Bonnell (Editor). The contents of all of these references are incorporated herein by reference in their entirety. Those skilled in the art will appreciate that existing microscopes lack sufficient contrast capability for a fuller understanding of the microscopic world.

SUMMARY OF THE INVENTION

In one aspect, the transmission ion microscope of the invention includes a bright light ion source that generates and ion beam. An electrostatic condenser lens means focuses the ion beam onto a sample. An objective lens focuses the ion beam transmitted through the sample to form an image and a projection lens enlarges the image. A phosphor screen receives the enlarged image to generate light allowing visualization of the image. In a preferred embodiment, the ion beam is a beam of helium ions. It is preferred that the source provide isolated ion emission sites of a small number of atoms. A preferred ion beam energy is in the range between 1000V and 1000 keV.

Another embodiment further includes a condenser aperture between the electrostatic condenser lens means and the sample to exclude high angle ions. An objective aperture and a selected area aperture between the objective lens and the projector lens may also be provided to restrict the beam. The objective aperture enhances contrast by blocking out high-angle diffracted electrons while the selected area aperture enables a user to examine the periodic diffraction of electrons by ordered arrangements of atoms in the sample. The electrostatic condenser lens means may include first and second condenser lenses. It is also preferred that the ion beam have a sub-nanometer beam diameter.

BRIEF DESCRIPTION OF THE DRAWING

The single FIGURE of the drawing is a schematic illustration of the transmission ion microscope according to one embodiment of the invention.

DESCRIPTION OF THE PREFERRED EMBODIMENTS

The transmission ion microscope of the invention works substantially the same way as known transmission electron microscopes (TEM) that can be thought of as an analogy to a slide projector. A slide projector shines a beam of light through a slide and as the light passes through it is affected by the structures and objects on the slide. These effects result in only certain parts of the light beam being transmitted through certain parts of the slide. The transmitted beam is then projected through a viewing screen forming an enlarged image of the slide.

Existing prior art transmission electron microscopes work the same way as a slide projector except that such microscopes shine a beam of electrons through a specimen rather than light. Whatever part of the electron beam is transmitted is projected onto a phosphor screen for the user to see. In the present invention, the source of ions replaces a source of electrons in a typical TEM.

With reference to the single FIGURE of the drawing, an ion source 10 generates preferably a sub-nanometer beam of ions. Helium ions are preferred. A suitable ion source is described in "Ion Sources for Nanofabrication and High Resolution Lithography", J. Melngailis, IEEE Proceedings of the 2001 Particle Accelerator Conference, Chicago, Ill. (2002), the contents of which are incorporated herein by reference. See, also "Growth and Current Charities of a Stable Field Ion Emitter," K. Jousten et al., Ultramicroscope 26, pp. 301–312 (1988) and "Maskless, Resistless Ion Beam Lithography Process," Qing Ji, Ph.D. Dissertation, Department of Electrical Engineering and Computer Sciences, University of California, Berkeley (2003), the contents of both of which are incorporated herein by reference. An ion beam 12 from the ion source 10 passes through first 14 and second 16 condenser lenses that focus the ion beam 12 to a small, thin, coherent beam. The first lens 14 (usually controlled by a "spot size knob") largely determines the "spot size" which is the general size range of the final spot that strikes a sample 18. The second condenser lens 16 (usually controlled by an "intensity or brightness knob") actually changes the size of the spot on the sample, changing it from a wide dispersed spot to a pinpoint beam. In this embodiment a condenser aperture 20 restricts the beam 12 by knocking out high angle ions, that is, ions far from the optic axis down the center of the microscope. After passing through the condenser aperture 20 the beam 12 strikes the sample 18 and parts of the beam are transmitted through the sample. The transmitted portion is focused by an objective lens 22 to form an image. An optional objective aperture 24 and optional selected area aperture 26 may be provided to restrict the transmitted beam. The objective aperture 24 enhances contrast by blocking high-angle diffracted ions while the selected area aperture 26 enables a user to examine the periodic diffraction of ions by ordered arrangements of ions in the sample 18.

The image formed by the objective lens 22 continues down the microscope column through intermediate lenses and a projector lens 28 and then strikes a phosphor image screen 30. The phosphor screen 30 generates light allowing the user to see the image. The darker areas of the image represent those areas of the sample through which fewer ions were transmitted (they are thicker or denser). The lighter areas of the image represent those areas of the sample through which more ions were transmitted (they are thinner or less dense). The high brightness ion source 10 produces a helium ion beam with energy between 1000V and 1000 keV. By limiting the number of emission sites that share the helium gas, a notable increase in current and density from the remaining emitting sites occurs. The lenses used in this embodiment are electrostatic lenses rather than the magnetic lenses typically used in TEMs. The microscope of the invention takes advantage of the unusually long range of light ions in matter. The collection of the transmitted (bright field) and/or scattered (dark field) ions will provide structural information about the sample in a manner never seen before. Further, the interaction dynamics of an ion beam with the sample material is different from the interaction of an electron beam in prior art microscopes. With the present invention, one will see more effects from the atomic centers and less from the electronic structure of the samples. This phenomenon may best be explained as "nuclear contrast." In a "bright field" picture dark pixels are a result of ions that interact with the atom nuclei in the sample which are then scattered away from the phosphor screen or absorbed in the sample. Bright pixels in the image are a result of ions that are not scattered or absorbed by the atoms in the sample. In the case of a "dark field" picture the contrast is reversed, or inverted, from the previous case.

The microscope of the invention is likely to be simpler, smaller and weigh less than a TEM because of the electrostatic optics used with the ion microscope of the invention. The contrast in the image will also be higher than with a TEM. The image will have more elemental contrast and the image quality may be enhanced with a charged neutralizer. The temperature of the sample may also change the quality of the image. Another contrast mechanism may arise from vibration in the sample as a result of interaction with the ion beam.

Because crystal orientation of the sample may be important, a tilting sample holder may be desirable and should also be capable of an X-Y motion. The contrast in the image may also be affected by voltage and a comparison of pictures taken at different voltages may provide yet another contrast mechanism. The energy loss of the beam at each position will also carry information about the composition of the sample material. We note that a traditional STIM uses high energy ion beams produced in accelerators and even then the resolution is limited to 50–100 nm. Low energy ion scatter spectroscopy may also be utilized to identify the elements in the sample.

What is claimed is:

1. A transmission ion microscope, comprising:
   a bright light ion source configured to generate an ion beam;
   a first condenser lens;
   a second condenser lens, the first and second condenser lenses being configured to focus the ion beam onto a sample;
   a condenser aperture between the second condenser lens and the sample, the condenser aperture being configured to exclude high angle ions;
   an objective lens configured to focus the ion beam transmitted through the sample to form an image;
   a projector lens configured to enlarge the image; and
   a screen configured to receive the enlarged image to generate light allowing visualization of the image.

2. The microscope of claim 1 wherein the ion beam comprises helium ions.

3. The microscope of claim 2 wherein the ion beam energy is between 1000V and 1000 keV.

4. The microscope of claim 1 wherein the ion source provides isolated ion emission sites of a small number of atoms.

5. The microscope of claim 1 further including an objective aperture and a selected area aperture between the objective lens and the projector lens.

6. The microscope of claim 1 wherein the ion beam has sub-nanometer beam diameter.

7. The microscope of claim 1, wherein the screen is a phosphor screen.

8. The transmission ion microscope of claim 7, wherein the ion source provides isolated ion emission sites of a small number of atoms.

9. The transmission ion microscope of claim 8, wherein the ion beam energy is between 1000 V to 1000 KeV.

10. The transmission ion microscope of claim 9, wherein the ion beam has sub-nanometer beam diameter.

11. The transmission ion microscope of claim 10, wherein the ion beam has sub-nanometer beam diameter.

12. A method, comprising:
   using the transmission ion microscope of claim 1 to image a sample.

13. A method, comprising:
   using the transmission ion microscope of claim 7 to image a sample.

14. A transmission ion microscope, comprising:
   an ion source configured to generate an ion beam;
   a first condenser lens;
   a second condenser lens;
   a condenser aperture; and
   an objective lens,
   wherein during use of the transmission ion microscope:
      the ion source creates an ion beam that passes through the first condenser lens, the second condenser and the condenser aperture before reaching the sample; and
      ions pass through the objective lens after passing through the sample.

15. The transmission ion microscope of claim 14, further comprising a projector lens, wherein during use of the transmission ion microscope ions pass through the projector lens after passing through the objective lens.

16. The transmission ion microscope of claim 15, further including an objective aperture and a selected aperture between the objective lens and the projector lens.

17. The transmission ion microscope of claim 16, further comprising a screen configured to receive ions after they pass through the projector lens.

18. The transmission ion microscope of claim 17, wherein the screen allows a user to see an image created by the projector lens.

19. The transmission ion microscope of claim 17, wherein the screen is a phosphor screen.

20. The transmission ion microscope of claim 14, wherein the ion beam has sub-nanometer beam diameter.

21. The transmission ion microscope of claim 20, wherein the ion beam energy is between 1000 V to 1000 KeV.

* * * * *

UNITED STATES PATENT AND TRADEMARK OFFICE
CERTIFICATE OF CORRECTION

PATENT NO. : 7,414,243 B2 Page 1 of 1
APPLICATION NO. : 11/146741
DATED : August 19, 2008
INVENTOR(S) : Ward It is certified that error appears in the above-identified patent and that said Letters Patent is hereby corrected as shown below:

On face page, in field (56), in column 1, under "U.S. Patent Documents", line 13, delete "250/423" and insert -- 250/423R --, therefor.

On face page, in field (56), in column 1, under "U.S. Patent Documents", line 18, delete "250/192.21" and insert -- 250/492.21 --, therefor.

On page 2, in column 1, under "Other Publications", line 39, delete "Interation" and insert -- Interaction --, therefor.

On page 2, in column 1, under "Other Publications", line 40, delete "Abastract" and insert -- Abstract --, therefor.

On page 2, in column 2, under "Other Publications", line 24, delete "Illinoise," and insert -- Illinois, --, therefor.

On page 2, in column 2, under "Other Publications", line 30, delete "ehanced" and insert -- enhanced --, therefor.

On page 3, in column 1, under "Other Publications", line 4, delete "Muclear" and insert -- Nuclear --, therefor.

In column 4, line 21, in claim 9, delete "KeV." and insert -- keV. --, therefor.

In column 4, line 49, in claim 16, after "selected" insert -- area --.

In column 4, line 62, in claim 21, delete "KeV." and insert -- keV. --, therefor.

Signed and Sealed this

Eighteenth Day of November, 2008

JON W. DUDAS
*Director of the United States Patent and Trademark Office*